(12) United States Patent
Aida

(10) Patent No.: US 7,422,792 B2
(45) Date of Patent: Sep. 9, 2008

(54) METALLIZED POLYMIDE FILM

(75) Inventor: Masayuki Aida, Aizuwakamatsu (JP)

(73) Assignee: Mitsubishi Shindoh Co., Ltd., Tokyo (JP)

( * ) Notice: Subject to any disclaimer, the term of this patent is extended or adjusted under 35 U.S.C. 154(b) by 0 days.

(21) Appl. No.: 11/042,621

(22) Filed: Jan. 24, 2005

(65) Prior Publication Data
US 2005/0170198 A1 Aug. 4, 2005

(30) Foreign Application Priority Data
Feb. 4, 2004 (JP) ............... 2004-027661

(51) Int. Cl.
B32B 15/04 (2006.01)
B32B 15/08 (2006.01)
B32B 15/20 (2006.01)

(52) U.S. Cl. .............. 428/458; 428/220; 428/332; 428/626; 428/674

(58) Field of Classification Search ................ 428/674, 428/675, 680, 632, 457, 458, 473.5, 213, 428/215, 219, 220, 332, 336, 340, 341, 626
See application file for complete search history.

(56) References Cited

U.S. PATENT DOCUMENTS 5,130,192 A * 7/1992 Takabayashi et al. ....... 428/332
5,667,851 A * 9/1997 Edman et al. ................. 205/95
6,284,329 B1 * 9/2001 Matienzo et al. ............ 427/537
2003/0148078 A1 * 8/2003 Aida .......................... 428/209

FOREIGN PATENT DOCUMENTS

| JP | 05-145202 | * | 6/1993 |
| JP | 06-029634 | * | 2/1994 |
| JP | 2002-280684 | * | 9/2002 |
| JP | 2003-011273 | * | 1/2003 |
| JP | 2003-011273 A | * | 1/2003 |

* cited by examiner

Primary Examiner—Michael La Villa
(74) Attorney, Agent, or Firm—Kolisch Hartwell, P.C.

(57) ABSTRACT

A metallized polyimide film includes: a polyimide film including a first side and a second side; an intermediate layer that contains at least one element selected from the group consisting of Mo, Cr, Ni, Si, Fe, and Al, a deposition amount of the at least one element being between 0.3 and 15 mg/m²; and a conductive layer that is made of one of copper and a copper alloy formed on the intermediate layer; an oxygen and water barrier film that is made of at least one member selected from the group consisting of silicon oxide, aluminum oxide, titanium oxide, tin oxide, indium oxide, magnesium fluoride, magnesium oxide, aluminum, and indium tin oxide (ITO), and that has a thickness of between 5 and 300 nm formed on the second side of the polyimide film.

3 Claims, 1 Drawing Sheet

METALLIZED POLYMIDE FILM

BACKGROUND OF THE INVENTION

1. Field of the Invention

The present invention relates to a metallized polyimide film that includes a polyimide film and a conductive layer made of copper or the like formed on the surface of the polyimide film, and can be used as, for example, a TAB tape, a flexible circuit board, or a flexible wiring board.

Priority is claimed on Japanese Patent Application No. 2004-27661, filed Feb. 4, 2004, the content of which is incorporated herein by reference.

2. Description of Related Art

In recent years, in order to achieve reduction in the size and weight of electronic apparatuses and enhancement of the flexibility of the structure, there has been a growing demand for tape automated bonding (TAB) tapes, flexible circuit boards, flexible wiring boards, and the like. As substrates of these boards, flexible plastic substrates having a copper foil bonded thereon using adhesives, such as epoxy adhesive, have been employed conventionally.

However, the demand for high-density packaging of electronic apparatuses has required further reduction in the thickness of these substrates. However, the above-described flexible plastic substrates that are bonded with copper foil cannot meet this requirement for reducing the thickness.

In addition, the above-described circuit board using adhesive has several shortcomings as follows:

(1) An etching solution that is used in an etching of a copper foil easily migrates into an adhesive layer. When bias is applied under a high temperature and high humidity condition, copper may migrate to a plastic substrate, resulting in short-circuiting.
(2) For enhancing the operating speed, both impedance matching and reduction in crosstalk are required, both of which are difficult to achieve when an adhesive is used.
(3) The adhesive layer has poor dimensional stability.
(4) It is difficult to achieve high-density packaging since small patterns cannot be formed on a circuit board having the adhesive layer.
(5) The adhesive layer exhibits poor heat stability since the adhesive has inferior thermal properties compared to those of the material of a plastic substrate, which makes high-density packaging difficult.
(6) The circuit board easily deforms due to the adhesive.

In order to solve these problems, new techniques for forming a metallized film without using an adhesive have been studied. Several such techniques are known. For example, in one method, a metal thin film is formed directly on a plastic film according to circuit patterns using thin film formation techniques, including vacuum evaporation, sputtering, ion plating, or the like. Then, a metal plating layer is formed on the metal thin film using electroplating or the like. In another method, a metal thin film is formed on the surface of a plastic substrate, and then a metal is deposited using electroplating or the like. The conductive layer is etched to define circuit patterns.

However, these methods also have shortcomings. In a polyimide film having an excellent heat resistance, the bonding strength between the polyimide film and a metal is weaker than the bonding strength between the metal and other plastics. Thus, the bonding strength between the polyimide film and the metal thin film is reduced after the circuit pattern formation or the electroplating process is carried out, which may often result in peeling off.

Other methods have been used; for example, in one method, a polyimide monomer is coated on a copper foil and then heat cured to form a polyimide layer. In another method, a thermoplastic polyimide film and a copper foil are bonded together using the heat seal technique.

However, these methods have shortcomings in that the surface roughness of a metallized polyimide film is affected by the surface roughness of the copper foil employed, which may adversely affect a fine pattern formation process. In addition, since there is a limit to reducing the thickness of copper foils, it is difficult to achieve reduction in thickness.

In order to address these shortcomings, the present inventor proposed a metallized polyimide film including a polyimide film, a metal nucleus adhesion region formed on the surface of the polyimide film, and a metal layer formed on the surface of the metal nucleus adhesion region, which are disclosed in Japanese Unexamined Patent Application, First Publication No. 2003-011273.

The metal nucleus adhesion region is made of at least one metal selected from the group consisting of Mo, Cr, Ni, Si, Fe, and Al.

As applications of metallized polyimide films has become widespread, the metallized polyimide films are used in further harsh environments, which has created the demands for metallized polyimide films that have an excellent durability and extended service life at high temperatures and high humidity.

The present inventor has studied a metallized polyimide film that can be used at a high temperature environment, and it was discovered that the following events can occur when a metallized polyimide film is exposed to a temperature higher than the temperature at which a metallized polyimide film is used conventionally in the presence of oxygen and water.

When the metallized polyimide film is exposed to a high temperature, oxygen and water gradually infiltrate from the backside of the polyimide film and permeate into the polyimide film. If the oxygen and water infiltrate to the copper layer, the copper is oxidized. As a result, the decomposition of the polyimide due to hydrolysis reaction between the resulting copper ions and the polyimide occurs. Thus, the polyimide film is gradually decomposed in the vicinity of the interface with the copper layer, and the bonding strength between the copper layer and the polyimide film may weaken over a long period of time.

SUMMARY OF THE INVENTION

The present invention was conceived in light of the above-described circumstances, and an object thereof is to provide a metallized polyimide film that can enhance the bonding strength between a conductive layer and a polyimide film at high temperatures.

In order to solve the above-described problems, a first metallized polyimide film according to the present invention includes: a polyimide film including a first side and a second side; an intermediate layer that contains at least one element selected from the group consisting of Mo, Cr, Ni, Si, Fe, and Al, a deposition amount of the at least one element being between 0.3 and 15 mg/m$^2$; and an oxygen and water barrier film that is made of at least one member selected from the group consisting of silicon oxide, aluminum oxide, titanium oxide, tin oxide, indium oxide, magnesium fluoride, magnesium oxide, aluminum, and indium tin oxide (ITO), and that has a thickness of between 5 and 300 nm formed on the second side of the polyimide film.

Furthermore, a second metallized polyimide film according to the present invention includes: a polyimide film including a first side and a second side; an intermediate layer that contains at least one element selected from the group consisting of Mo, Cr, Ni, Si, Fe, and Al, a deposition amount of the at least one element being between 0.3 and 15 mg/m$^2$; and a conductive layer that is made of one of copper and a copper alloy formed on the intermediate layer; an oxygen and water barrier film that is made of at least one element selected from the group consisting of Al, Si, Ti, Cu, Zn, and Sn, and that has a thickness of between 100 and 300 nm formed on the second side of the polyimide film.

A second intermediate layer that is made of copper or a copper alloy and has a thickness of between 5 and 300 nm may be provided between the intermediate layer and the conductive layer.

Furthermore, the metallized polyimide film of the present invention may be a TAB tape, a flexible circuit board, a flexible wiring board, or the like.

In the metallized polyimide film according to the present invention, the oxygen and water barrier film prevents penetration of oxygen and water from the second side of the polyimide film even when the polyimide film is exposed to high temperatures. This prevents oxidation of copper in the conductive layer in the presence of oxygen and water, and the decomposition of the polyimide due to hydrolysis reaction between the resulting copper ions and the polyimide. Thus, peeling off of the conductive layer or the intermediate layer from the polyimide film is prevented even when the metallized polyimide film of the present invention is exposed to a temperature higher than the temperature at which a metallized polyimide film is used conventionally. Thus, a high reliability is achieved.

Furthermore, in the present invention, after the intermediate layer is formed by disposing very small amount of specific nucleation element on the surface of the polyimide film, the conductive layer is formed. Thus, the bonding strength between the polyimide film and the conductive layer can be enhanced. This further improves the bonding strength of the conductive layer when the metallized polyimide film is used at high temperatures.

DETAILED DESCRIPTION OF THE INVENTION

Figure 1:
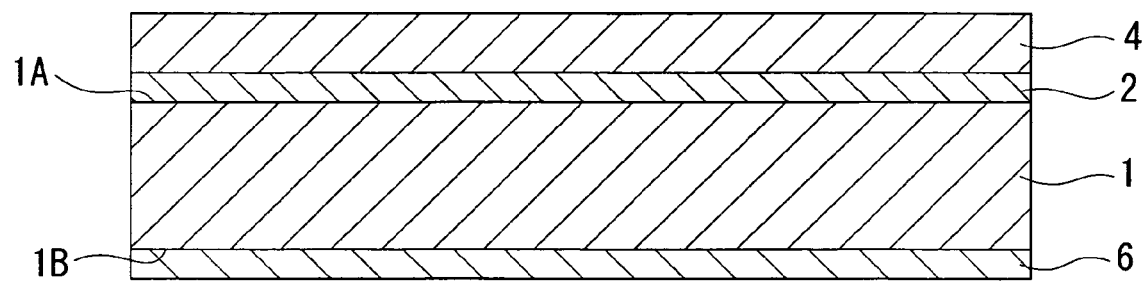
FIG. 1 is a enlarged cross-sectional view illustrating one embodiment of a metallized polyimide film according to the present invention.

FIG. 1 is a enlarged cross-sectional view illustrating one embodiment of a metallized polyimide film according to the present invention. This metallized polyimide film includes a polyimide film 1, an intermediate layer 2 formed on a first side 1A of the polyimide film 1, a conductive layer 4 formed on the intermediate layer 2, and an oxygen and water barrier film 6 formed on a second side 1B of the polyimide film 1.

The polyimide film 1 may be made of any polyimide resins that are used for metallized polyimide films in the art, and may be made of a biphenyl tetracarboxylic dianhydride (BPDA) based polyimide resin or a pyromellitic dianhydride (PMDA) based polyimide resin. In general, a polyimide film derived from BPDA (e.g., "Upilex" that is commercially available from UBE Industries, Ltd., or the like) exhibits excellent dimensional stabilities over temperature and moisture absorption and high rigidity, and is primarily used for TAB. The bonding strength of a BPDA-based polyimide film with a metal thin film, however, is weak. In contrast, it is believed that a polyimide film derived from PMDA (e.g., "Kapton" that is commercially available from Du Pont-Toray Co., Ltd., or "APLICAL" that is commercially available from Kaneka Corporation) exhibits an excellent bonding strength with a metal thin film. The polyimide film 1 preferably has a thickness of between 12 μm and 125 μm although the present invention is not limited to this thickness range.

The polyimide film 1 may be a single-layered film, or may have a multilayered structure in which films made of polyimide resins in different kinds are stacked together. The first side 1A of the polyimide film 1 on which the intermediate layer 2 is formed may be a BPDA-based or PMDA-based polyimide resin, and both a BPDA-based and a PMDA-based polyimide resins provide similar effects.

The intermediate layer 2 is made of at least one nucleation element selected from the group consisting of Mo, Cr, Ni, Si, Fe, and Al and some unavoidable impurities, and the intermediate layer 2 acts to strengthen the bonding strength between the polyimide film 1 and the conductive layer 4 by facilitating adhesion of copper atoms when the conductive layer 4 is formed. The deposition amount (thickness) of the intermediate layer 2 is between 0.3 and 15 mg/m$^2$, and the intermediate layer 2 is neither a continuous nor dense film. The intermediate layer 2 and the conductive layer 4 are patterned in advance into desired patterns.

If the deposition amount of the metal in the intermediate layer 2 is less than 0.3 mg/m$^2$, a sufficiently strong bonding of the conductive layer 4 to the polyimide film 1 cannot be obtained. In addition, if the amount of deposited metal in the intermediate layer 2 is more than 15 mg/m$^2$, the deposited nucleation element are oxidized, which causes a significant deterioration of the adhesion strength of the conductive layer 4. Furthermore, for etching the conductive layer 4 to pattern the layer, the intermediate layer 2 is required to be etched along with the conductive layer 4. Therefore, if the intermediate layer 2 is too thick, the etching process may become inefficient.

It was believed that when a metal, such as molybdenum, is used to enhance a bonding strength of the conductive layer 4 to a polyimide film, it is required to deposit a molybdenum layer thick enough to form a film. However, in the present invention, it is possible to sufficiently enhance the bonding strength of the conductive layer 4 by disposing only a very small amount of a metal on the polyimide film 1.

The deposition amount in the intermediate layer 2 is more preferably between 0.9 and 10 mg/m$^2$. If the deposition amount is within this range, the manufacturing cost can be reduced and the bonding strength of the conductive layer 4 can be stably enhanced. It should be noted that the deposition amount of the nucleation element can be measured by the inductively coupled plasma spectrometry (ICP), or any other technique.

Since the deposition amount of the intermediate layer 2 is very small, i.e., between 0.3 and 15 mg/m$^2$, the intermediate layer 2 does not form a film. Rather, it is considered that particles of the metal are adhered to the surface, particularly to active sites, of the polyimide film 1 to form nucleation particles, and such nucleation particles are dispersed.

The intermediate layer 2 is made of at least one member selected from the group consisting of Mo, Cr, Ni, Si, Fe, and Al, and alloys substantially made of at least two elements consisting of the group consisting of Mo, Cr, Ni, Si, Fe, and Al. Among them, experiments conducted by the present inventor proved that Mo and Si provided a great bonding strength, and this high bonding strength was maintained after a durability test.

One or more second intermediate layer that can be adhered with the conductive layer 4 with a high adhesion strength may be formed by evaporated between the intermediate layer 2 and the conductive layer 4. The second intermediate layer is preferably made of copper or a copper alloy since the adhesion between the film base material and the metal layer can be further improved by using copper while maintaining a high electric conductivity. The second intermediate layer preferably has a thickness of between 5 and 300 nm.

The intermediate layer 2 can be formed on the polyimide film 1 by depositing the nucleation element on the polyimide film 1 using any known thin film formation techniques, including vacuum evaporation, sputtering, ion plating, or the like. Among them, sputtering and ion plating techniques are more preferable to deposit the nucleation element. Film formation conditions are not particularly limited, but the partial pressures of oxygen and water in the film formation chamber or bath are preferably minimized in order to prevent oxidation of the nucleation element.

The conductive layer 4 is preferably made of copper or a copper alloy, and pure copper, or a copper alloy containing nickel, zinc, iron, or the like is especially preferable. The conductive layer 4 has a thickness of 10 nm or more, and more preferably has a thickness of 30 nm or more. If the conductive layer 4 is too thick, the production cost is increased, whereas a failure, such as burnout, may easily occur in a plating process if the thickness is small.

The conductive layer 4 may be formed using any known thin film formation techniques, including vacuum evaporation, sputtering, ion plating, or the like. The metal layer 4 may be formed by simply depositing the intermediate layer 2 that is formed on the polyimide film 1. Alternatively, the conductive layer 4 may be formed by depositing a thin metal film using any known film deposition technique, and then forming another a metal plating layer on the thin film using an electroplating or electroless plating technique.

In the first aspect of the present invention, the oxygen and water barrier film 6 may be made of at least one material selected from the group consisting of silicon oxide, aluminum oxide, titanium oxide, tin oxide, indium oxide, magnesium fluoride, magnesium oxide, aluminum, and indium tin oxide (ITO). Silicon oxide or aluminum oxide is especially preferable as the material of the oxygen and water barrier film 6 since they exhibit an excellent barrier property against oxygen and water.

According to the first aspect of the present invention, the oxygen and water barrier film 6 preferably has a thickness of between 5 and 300 nm. If the thickness is less than 5 nm, a sufficient shield effect against oxygen and water cannot be obtained. In contrast, if the thickness of the oxygen and water barrier film 6 is more than 300 nm, the production cost is increased without further improvement in the shield effect. The oxygen and water barrier film 6 more preferably has a thickness of between 20 and 150 nm. The technique to form the oxygen and water barrier film 6 is not particularly limited, but the physical vapor deposition (PVD), chemical vapor deposition (CVD), or the like, are preferable.

According to the second aspect of the present invention, the oxygen and water barrier film 6 is made of at least one element selected from the group consisting of Al, Si, Ti, Cu, Zn, and Sn. Among these elements, Al and Cu are especially preferable as the material of the oxygen and water barrier film 6 since they exhibit an excellent barrier property against oxygen and water.

According to the second aspect of the present invention, the oxygen and water barrier film 6 preferably has a thickness of between 100 and 300 nm. If the thickness is less than 100 nm, a sufficient shield effect against oxygen and water cannot be obtained. In contrast, if the thickness of the oxygen and water barrier film 6 is more than 300 nm, the production cost is increased without further improvement in the shield effect. The oxygen and water barrier film 6 more preferably has a thickness of between 100 and 200 nm. The technique to form the oxygen and water barrier film 6 is not particularly limited, but the physical vapor deposition (PVD), chemical vapor deposition (CVD), or the like, are preferable.

In the metallized polyimide films according to the above-described aspects of the present invention, the oxygen and water barrier film 6 prevents penetration of oxygen and water from the second side 1B of the polyimide film 1 even when the polyimide film is exposed to high temperatures. This prevents oxidation of copper in the conductive layer 4 in the presence of oxygen and water, and the decomposition of the polyimide due to hydrolysis reaction between the resulting copper ions and the polyimide. Thus, peeling off of the conductive layer 4 or the intermediate layer 2 from the polyimide film 1 is prevented even when the metallized polyimide film of the present invention is exposed for a long time to a temperature higher than the temperature at which a metallized polyimide film is used conventionally. Thus, a high reliability is achieved. The metallized polyimide film of the present invention is suitably used as on-vehicle components that are often used at high temperatures and high humidity. This advantage can be evaluated using, for example, high temperature environment tests.

Furthermore, in the present invention, after the intermediate layer 2 is formed by disposing a very small amount of a specific nucleation element on the surface of the polyimide film 1, the conductive layer 4 is formed. Thus, the bonding strength between the polyimide film 1 and the conductive layer 4 can be enhanced. This further improves the bonding strength of the conductive layer 4 when the metallized polyimide film is used at high temperatures. In addition, this high bonding strength is obtained both when the intermediate layer 2 is formed on a BPDA-based polyimide and when the intermediate layer 2 is formed on a PMDA-based polyimide.

Furthermore, the oxygen and water barrier film 6 eliminates the need to form the intermediate layer 2 to a thickness thick enough to be a barrier to oxygen and water. Thus, it is possible to reduce the thickness of the intermediate layer 2, and accordingly the intermediate layer 2 can be easily etched together with the conductive layer 4. Advantageously, modification of conditions for etching the conductive layer 4 is not necessary despite the presence of the intermediate layer 2.

EXAMPLES

The advantageous effects of the present invention are examined in the following examples.

Example 1

"Upilex-S" (brand name) that is commercially available from UBE Industries, Ltd., having a thickness of 75 µm, was used as the base material of the polyimide film, and the two sides of the film base material were subjected to plasma surface treatment under the following conditions:

Plasma treatment condition: Gas Ar, RF output 1.5 kW, processing time 20 min

Then, the film base material was introduced into electron beam evaporation equipment, and an oxygen and water barrier film made of silicon oxide was formed to a thickness of 30 nm using the following conditions.

Oxygen and Water Barrier Film
  Ultimate pressure: $1 \times 10^{-3}$ Pa
  Electron beam power: 150 mA Then, the film base material was turned upside down and introduced in sputtering equipment. An intermediate layer and a second intermediate layer were formed on a side opposing to the side on which the oxygen and water barrier film had been formed using the following conditions:

Intermediate Layer
  Material: Ni—Cr alloy
  Deposition Conditions: Gas Ar, RF power 200 W
  Thickness: 3 nm Second Intermediate Layer
  Material: Cu
  Deposition Conditions: Gas Ar, RF power 200 W
  Thickness: 200 nm
  Furthermore, a conductive layer made of copper is formed on the second intermediate layer to a thickness of 18 μm with copper electroplating using a copper sulfate bath to obtain a sample of Example 1.

Example 2

The same polyimide film base material as Example 1 was used, and the surfaces of the polyimide film base were subjected to the plasma surface treatment using the same conditions as in Example 1. Then, the film base material was introduced into the electron beam evaporation equipment, and an oxygen and water barrier film made of aluminum oxide was formed to a thickness of 30 nm using the following conditions.

Oxygen and Water Barrier Film
  Ultimate pressure: $1 \times 10^{-3}$ Pa
  Electron beam power: 200 mA
  Then, an intermediate layer, a second intermediate layer, and a conductive layer were formed using the same materials and conditions as in Example 1 to obtain a sample of Example 2.

Example 3

The same polyimide film base material as Example 1 was used, and the surfaces of the polyimide film base were subjected to the plasma surface treatment using the same conditions as in Example 1. An oxygen and water barrier film made of silicon oxide was formed under the same conditions as in Example 1.

Then, the film base material was turned upside down and introduced in the sputtering equipment. An intermediate layer was formed on a side opposing to the side on which the oxygen and water barrier film had been formed using the following conditions:

Intermediate Layer
  Material: Mo
  Deposition Conditions: Gas Ar, RF power 200 W
  Thickness: 3 nm
  Furthermore, a second intermediate layer and a conductive layer were deposited using the same materials and conditions as in Example 1 to obtain a sample of Example 3.

Example 4

The same polyimide film base material as Example 1 was used, and the surfaces of the polyimide film base were subjected to the plasma surface treatment using the same conditions as in Example 1. An oxygen and water barrier film made of aluminum oxide was formed under the same conditions as in Example 2.

Then, the film base material was turned upside down and introduced in the sputtering equipment. An intermediate layer, a second intermediate layer, and a conductive layer were formed on a side opposing to the side on which the oxygen and water barrier film had been formed using the same materials and conditions as Example 3 to obtain a sample of Example 4.

Example 5

The same polyimide film base material as Example 1 was used, and the surfaces of the polyimide film base were subjected to the plasma surface treatment using the same conditions as in Example 1. Then, the film base material was introduced into the electron beam evaporation equipment, and an oxygen and water barrier film made of aluminum was formed to a thickness of 100 nm using the following conditions.

Oxygen and Water Barrier Film
  Ultimate pressure: $1 \times 10^{-3}$ Pa
  Electron beam power: 150 mA
  Then, an intermediate layer, a second intermediate layer, and a conductive layer were formed using the same materials and conditions as in Example 1 to obtain a sample of Example 5.

Example 6

The same polyimide film base material as Example 1 was used, and the surfaces of the polyimide film base were subjected to the plasma surface treatment using the same conditions as in Example 1. Then, the film base material was introduced into the electron beam evaporation equipment, and an oxygen and water barrier film made of titanium was formed to a thickness of 100 nm using the following conditions.

Oxygen and Water Barrier Film
  Ultimate pressure: $1 \times 10^{-3}$ Pa
  Electron beam power: 220 mA
  Then, an intermediate layer, a second intermediate layer, and a conductive layer were formed using the same materials and conditions as in Example 1 to obtain a sample of Example 6.

Example 7

The same polyimide film base material as Example 1 was used, and the surfaces of the polyimide film base were subjected to the plasma surface treatment using the same conditions as in Example 1. Then, the film base material was introduced into the electron beam evaporation equipment, and an oxygen and water barrier film made of copper was formed to a thickness of 100 nm using the following conditions.

Oxygen and Water Barrier Film
  Ultimate pressure: $1 \times 10^{-3}$ Pa
  Electron beam power: 170 mA
  Then, an intermediate layer, a second intermediate layer, and a conductive layer were formed using the same materials and conditions as in Example 1 to obtain a sample of Example 7.

Comparative Example 1

The same polyimide film base material as Example 1 was used, and the surfaces of the polyimide film base were subjected to the plasma surface treatment using the same conditions as in Example 1. Then, without forming an oxygen and water barrier film, an intermediate layer (made of Mo), a second intermediate layer, and a conductive layer were formed using the same materials and conditions as Example 3 to obtain a sample of Comparative Example 1.

Comparative Example 2

The same polyimide film base material as Example 1 was used, and the surfaces of the polyimide film base were subjected to the plasma surface treatment using the same conditions as in Example 1. Then, without forming an oxygen and water barrier film, an intermediate layer (made of a Ni—Cr alloy), a second intermediate layer, and a conductive layer were formed using the same materials and conditions as in Example 1 to obtain a sample of Comparative Example 2.

Comparative Example 3

The same polyimide film base material as Example 1 was used, and the surfaces of the polyimide film base were subjected to the plasma surface treatment using the same conditions as in Example 1. Then, without forming an oxygen and water barrier film and an intermediate layer, a second intermediate layer and a conductive layer were formed using the same materials and conditions as in Example 1 to obtain a sample of Comparative Example 3.

Evaluations

A strip specimen with a width of 10 mm by a length of 150 mm was cut from each of the metallized polyimide film samples of Examples 1 to 7 and Comparative Examples 1 to 3. The peeling off strength (peel strength) between the film base material and the conductive layer of each specimen was evaluated according to the test method prescribed in IPC-TM-650 (test method manual by ICP). In this test, the polyimide film side of a strip specimen is adhered to an outer rim of a 6-inch-diameter drum, and the load (kN/m) required to peel off the metal film from the polyimide film was measured by pulling one end of the metal film with a tool while peeling off the metal film from the specimen at an angle of 90° with respect to the polyimide film at a speed of 5 cm/min.

The peeling off strength of each of the specimens from Examples 1 to 7 and Comparative Examples 1 to 3 were measured after the test samples were subjected to a heat treatment. In the heat treatment, the specimens were heated at 150° C. in the air for 168 hours.

Furthermore, peeling off strength of each of the specimens from Examples 1 to 7 and Comparative Examples 1 to 3 were measured after the specimens were subjected to a high-pressure and high humidity treatment (known as "the pressure cooker test (PCT) treatment"). The condition of the PCT treatment was such that the specimens were allowed to stand at a temperature of 121° C. and a humidity of 100% for 48 hours.

The results are listed in Table 1.

TABLE 1

| | Structure | | Peel strength (kN/m) | | |
|---|---|---|---|---|---|
| | Inter. layer | $O_2$ and $H_2O$ barrier layer | No treatment | Heat treatment | PCT |
| Example 1 | Ni—Cr | silicon oxide | 1.25 | 1.12 | 1.02 |
| Example 2 | Ni—Cr | aluminum oxide | 1.30 | 1.10 | 1.03 |
| Example 3 | Mo | silicon oxide | 1.35 | 1.10 | 1.02 |
| Example 4 | Mo | silicon oxide | 1.29 | 1.12 | 1.03 |
| Example 5 | Ni—Cr | aluminum | 1.27 | 1.08 | 1.11 |
| Example 6 | Ni—Cr | titanium | 1.27 | 1.02 | 0.98 |
| Example 7 | Ni—Cr | copper | 1.29 | 1.04 | 1.00 |
| Comp. Example 1 | Mo | none | 1.32 | 0.30 | 1.01 |
| Comp. Example 2 | Ni—Cr | none | 1.20 | 0.44 | 0.99 |
| Comp. Example 3 | none | none | 0.18 | 0.00 | 0.05 |

As shown in Table 1, all specimens of Examples 1 to 7 exhibited a high peel strength after both the heat treatment and the PCT treatment. In particular, the specimens of Examples 1 to 5 exhibited a peel strength of between 1.08 kN/m and 1.12 kN/m, while the specimens of Examples 5 to 7 exhibited a peel strength of between 1.02 kN/m and 1.08 kN/m.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A metallized polyimide film comprising:
   a polyimide film comprising a first side and a second side;
   an intermediate layer that contains at least one element selected from the group consisting of Mo, Cr, Ni, Si, Fe, and Al, a deposition amount of the at least one element being between 0.3 and 15 mg/in$^2$; and
   a conductive layer that is made of one of copper and a copper alloy formed on the intermediate layer;
   an oxygen and water barrier film that is made of at least one member selected from the group consisting of silicon oxide, aluminum oxide, titanium oxide, tin oxide, indium oxide, magnesium fluoride, magnesium oxide, aluminum, and indium tin oxide (ITO), and that has a thickness of between 5 and 300 nm formed on the second side of the polyimide film;
   wherein the film has a peel strength after a heat treatment that is between 1.08 kN/m and 1.12 kN/m.

2. A metallized polyimide film comprising:
   a polyimide film comprising a first side and a second side;
   an intermediate layer that contains at least one element selected from the group consisting of Mo, Cr, Ni, Si, Fe, and Al, a deposition amount of the at least one element being between 0.3 and 15 mg/in$^2$; and
   a conductive layer that is made of one of copper and a copper alloy formed on the intermediate layer;
   an oxygen and water barrier film that is made of at least one element selected from the group consisting of Al, Si, Ti, Cu, Zn, and Sn, and that has a thickness of between 100 and 300 nm formed on the second side of the polyimide film;

wherein the film has a peel strength after a heat treatment that is between 1.02 kN/m and 1.08 kN/m.

3. A metallized polyimide film comprising:

a polyimide film comprising a first side and a second side;

an intermediate layer that contains at. least one element selected from the group consisting of Mo, Cr, Ni, Si, Fe, and Al, a deposition amount of the at least one element being between 0.3 and 15 mg/in$^2$; and a conductive layer that is made of one of copper and a copper alloy formed on the intermediate layer;

an oxygen and water barrier film that is made of at least one member selected from the group consisting of silicon oxide, aluminum oxide, titanium oxide, tin oxide, indium oxide, magnesium fluoride, magnesium oxide, Al, Si, Ti, Cu, Zn, Sn, and indium tin oxide (ITO), and that has a thickness of between 5 and 300 nm formed on the second side of the polyimide film, wherein the film has a peel strength after a heat treatment that is between 1.02 kN/m and 1.12 kN/m.

* * * * *